United States Patent
Ikegawa et al.

(10) Patent No.: US 7,203,088 B2
(45) Date of Patent: Apr. 10, 2007

(54) MAGNETORESISTIVE RANDOM ACCESS MEMORY AND DRIVING METHOD THEREOF

(75) Inventors: Sumio Ikegawa, Tokyo (JP); Yoshihisa Iwata, Kanagawa-Ken (JP); Kenji Tsuchida, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/067,670

(22) Filed: Mar. 1, 2005

(65) Prior Publication Data

US 2005/0195644 A1    Sep. 8, 2005

(30) Foreign Application Priority Data

Mar. 5, 2004  (JP)  ............................. 2004-062788

(51) Int. Cl.
    *G11C 11/00*    (2006.01)
(52) U.S. Cl. .......................................... 365/158; 365/50
(58) Field of Classification Search ............... 365/158, 365/50
    See application file for complete search history.

(56) References Cited

U.S. PATENT DOCUMENTS

| 6,134,138 A | 10/2000 | Lu et al. |
| 6,545,906 B1 | 4/2003 | Savtchenko et al. |
| 6,667,899 B1 * | 12/2003 | Subramanian et al. ...... 365/158 |
| 6,744,663 B2 | 6/2004 | Garni et al. |
| 6,834,008 B2 * | 12/2004 | Rinerson et al. ............ 365/158 |
| 6,909,631 B2 * | 6/2005 | Durlam et al. .............. 365/158 |

OTHER PUBLICATIONS

U.S. Appl. No. 11/052,810, filed Feb. 9, 2005, Iwata.

* cited by examiner

*Primary Examiner*—Amir Zarabian
*Assistant Examiner*—Kretelia Graham
(74) *Attorney, Agent, or Firm*—Oblon, Spivak, McClelland, Maier & Neustadt, P.C.

(57) ABSTRACT

The number of read errors can be reduced, and a large read signal can be produced. A method of driving a magnetoresistive random access memory including memory cells, a state of which is switched between binary resistance values using a single kind of write pulses is proposed, the method comprising: selecting a memory cell; reading a resistance value, which is one of the binary resistance values, of the selected memory cell, the resistance value read being defined as a first resistance value; performing a first write operation on the selected memory cell using the write pulse to change the resistance value of the selected memory cell to the other of the binary resistance values; reading the other of the binary resistance values, which is defined as a second resistance value; comparing the second resistance value with the first resistance value, and determining data originally stored in the selected memory cell based on the comparison result; and performing a second write operation on the selected memory cell using the write pulse to change the second resistance value of the selected memory cell to the first resistance value.

18 Claims, 12 Drawing Sheets

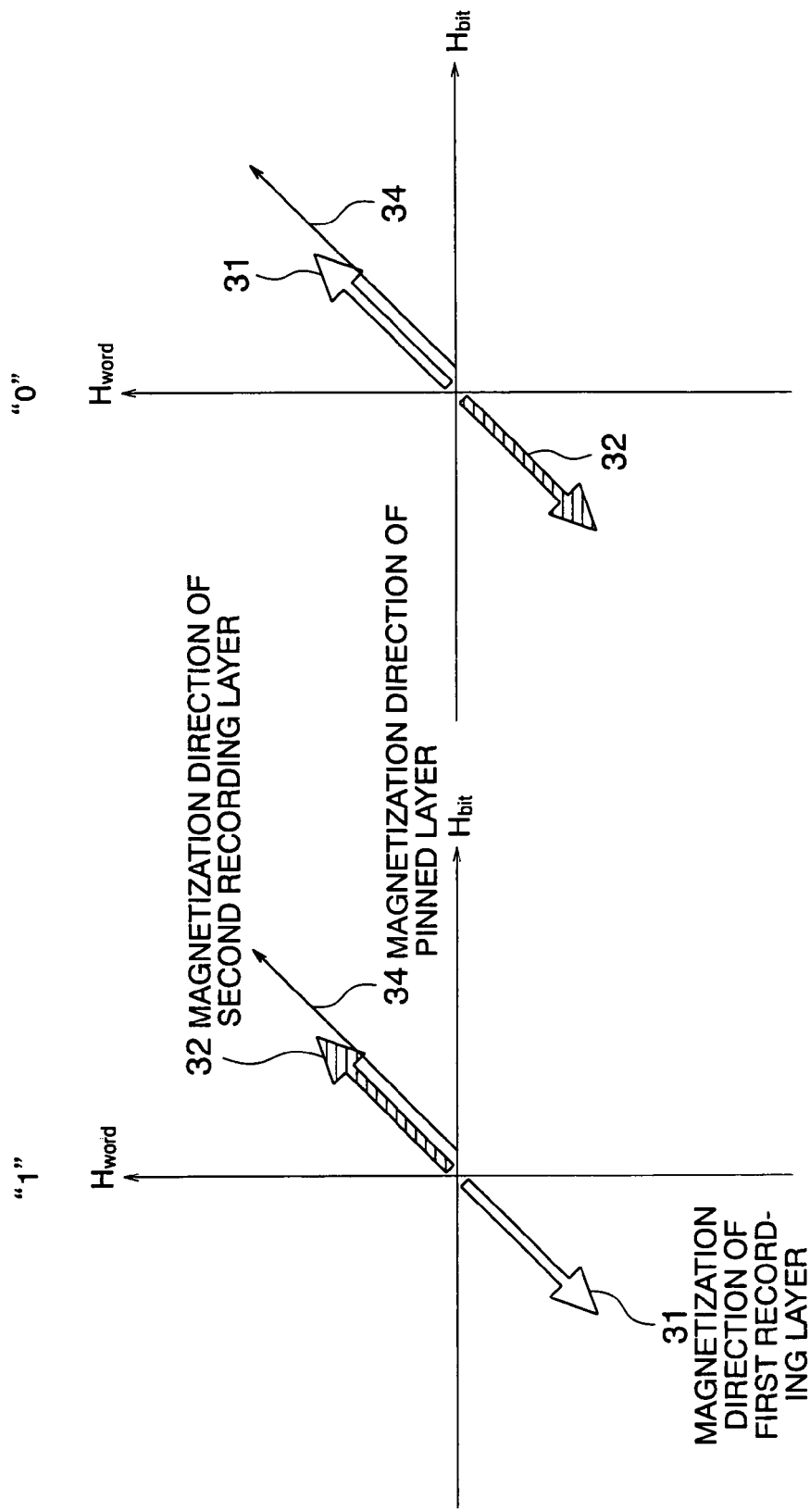

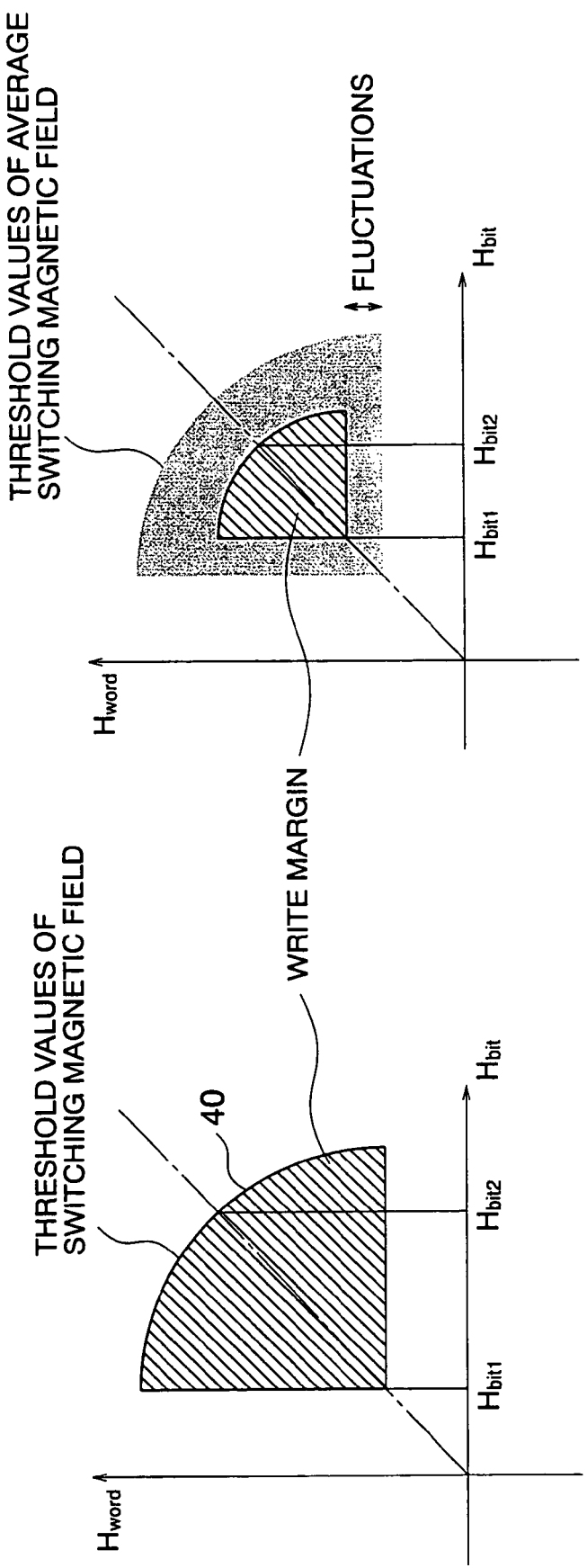

MAGNETORESISTIVE RANDOM ACCESS MEMORY AND DRIVING METHOD THEREOF

CROSS-REFERENCE TO RELATED APPLICATION

This application is based upon and claims the benefit of priority from prior Japanese Patent Application No. 2004-62788, filed on Mar. 5, 2004 in Japan, the entire contents of which are incorporated herein by reference.

BACKGROUND OF THE INVENTION

1. Field of the Invention

The present invention relates to a magnetoresistive random access memory (MRAM) and a driving method thereof.

2. Background Art

A magnetoresistive random access memory (hereinafter also referred to as MRAM) is a memory device using magnetic elements having magnetoresistance effects in a memory cell. Magnetoresistive random access memories have been attracting attention as next generation memory devices characterized by high-speed operation, large capacity, and nonvolatility. A magnetoresistance effect is a phenomenon that occurs when a magnetic field is applied to a ferromagnetic material, electric resistance changes in accordance with the direction of magnetization of the ferromagnetic material. It is possible to operate a ferromagnetic material as a memory device by using the direction of magnetization of the ferromagnetic material to record data, and reading the data based on the magnitude of corresponding electric resistance. Recently, an MRAM using a tunneling magnetoresistance effect (hereinafter also referred to as TMR) in a magnetic tunnel junction, which has a sandwich structure in which an insulating layer (tunnel barrier layer) is inserted between two ferromagnetic layers (hereinafter also referred to as MTJ), has been attracting attention after it was found that more than 20% of magnetoresistive variation rate (MR ratio) can be obtained by the tunneling magnetoresistance effect (TMR effect).

When a TMR element is used as a magnetic element of a memory cell of an MRAM, a magnetization pinned layer, in which the direction of magnetization is pinned, and which serves as a magnetization reference layer, is used as one of two ferromagnetic layers sandwiching a tunnel barrier layer, and a magnetization free layer, in which the direction of magnetization can be reversed, and which serves as a magnetization recording layer, is used as the other. In order to fix the direction of magnetization of the magnetization pinned layer, an antiferromagnetic layer is provided so as to contact the ferromagnetic layer, thereby preventing magnetization reversal by the use of exchange coupling force. It is possible to store information by assigning binary data items "0" and "1" to the state where the magnetization directions of the magnetization pinned layer and the recording layer are in parallel with each other, and the state where they are antiparallel with each other.

The writing of information to be recorded is performed by reversing the direction of magnetization of the recording layer with an induced magnetic field generated by passing a current through a write wiring line provided in the vicinity of the TMR element. In general, the direction of a bit line current for "0"-write operation is opposite to that for "1"-write operation. It is preferable that the magnetic field required for the magnetization reversal of the recording layer, i.e., the switching magnetic field, be as small as possible within the range where the thermal stability can be ensured. In order to decrease write errors, it is preferable that the bit-per-bit fluctuation in the switching magnetic field be as small as possible. The reading of recorded information is performed by detecting the change in resistance caused by the TMR effect. Thus, in a TMR element used to form an MRAM, it is preferable that the MR ratio due to the TMR effect be as large as possible. In order to read the information accurately, it is preferable that the resistance fluctuations be as small as possible.

When the magnetization direction of a recording layer is in parallel with that of a pinned layer, the resistance of the TMR element is low. This state is defined as, e.g., "0". When the magnetization direction of a recording layer is antiparallel with that of a pinned layer, the resistance of the TMR element is high. This state is defined as, e.g., "1". Whether the recording layer is in the "0" state or the "1" state is read by determining whether the recording layer is in a low resistance state or high resistance state by passing a current though the TMR element.

Next, conventional read methods will be described. First, a method called "external reference method" will be described below. In this method, whether the recording layer is in the "0" state or "1" state is determined by providing a reference resistance having a resistance value which is between that of the "0" state and that of the "1" state, and detecting whether the resistance value of the memory cell to be read is smaller or larger than the resistance value of the reference resistance. In this case, it is necessary that the difference between the resistance value of the reference resistance and the resistance value in the "0" state and the difference between the resistance value of the reference resistance and the resistance value in the "1" state be considerably larger than the fluctuations in resistance value of the TMR element forming the memory cell of an MRAM. That is to say, in order to decrease read errors, it is preferable that the MR ratio of the TMR element be as large as possible, and the fluctuations in resistance value of the TMR element be as small as possible.

In order to be a general-purpose memory with a low bit cost, an MRAM should be of a large capacity and high density. However, when the number of entire bits in a chip increases, the number of bits in which the resistance value is far away from the mean value increases. Thus, in a case where an MRAM has a large capacity and high density, the MR ratio of the TMR element thereof is small, and the resistance fluctuation of the TMR element is great, the number of read errors increases since the difference between the mean value of the resistance distribution in the "0" state and the mean value of the resistance distribution in the "1" state becomes smaller, and the tail of the resistance distribution in the "0" or "1" state overlaps the resistance value of the reference resistance. That is to say, the probability become higher where a memory cell storing a data item "1" is read as storing a data item "0" because the resistance value thereof is lower than the reference resistance value. In such a case, an external reference read method using the external reference resistance value cannot be utilized.

In order to deal with such a case, a read method called "self-reference method" is proposed (for example, U.S. Pat. No. 6,134,138). In this self-reference method, an original data recorded in a bit noticed is determined by measuring the change in resistance value caused by a write operation on the bit. Since the difference in resistance value at the time of comparison is the difference ΔR between the resistance value in the "0" state, and the resistance value in the "1" state, it is possible to produce a signal having a signal value twice as large as that of an external reference method. That is to say, this method is twice as resistant to the fluctuation in resistance value. The reading process of this self-reference method will be described below.

(i). First, a first read operation is performed to read and store a resistance value (the value actually read is a current value or voltage value). In a circuit configuration, for example, the voltage thereof is stored in a first capacitance in a read circuit.

(ii). Next, a trial data item, e.g., "0", is written.

(iii). Next, a second read operation is performed to read and store the resistance value of the trial data item. In a circuit configuration, for example, the voltage thereof is stored in a second capacitance in a read circuit.

(iv). Subsequently, the result of the first read operation is compared with the result of the second read operation and evaluated. When there is no difference, the original data item is the same as the trial data item, i.e., "0", and when there is a difference, the original data item is opposite to the trial data item, i.e., "1".

(v). Then, based on the evaluation result in step (iv), "1" is rewritten to only the bits originally having data items opposite to the trial data item.

This read process is described using the case where the trial data item is "0". However, the trial data item can be "1". This read method is effective when the same trial data item can be written to all of the bits in a single write operation.

Another MRAM writing method is known, in which a TMR element is alternately switched between binary resistance values with the same direction of write current (for example, U.S. Pat. No. 6,545,906). The TMR element constituting the MRAM disclosed in U.S. Pat. No. 6,545,906 has a synthetic antiferromagnetic (SAF) recording layer, which is composed of a plurality of ferromagnetic layers. A non-magnetic metal layer is inserted between the ferromagnetic layers. The ferromagnetic layers are coupled by anti-ferromagnetic coupling via the non-magnetic metal layer. In this MRAM writing method, the current flowing through a bit line for the "0"-write operation has the same sign as that for the "1"-write operation. And also the current flowing through a word line for the "0"-write operation has the same sign as that for the "1"-write operation. When write pulses are given at predetermined times, every time a write pulse is given, the sate alternately changes between "1" and "0". Accordingly, when the initial states ("0" or "1") of bits are unknown, such bits cannot be written to have the same data item as the trial data item, e.g., "0", in a single write operation. When the original data item is "0", after a write operation, the state changes to "1", and on the contrary, when the original data item is "1", after a write operation, the state changes to "0". For this reason, the conventional "self-reference method" does not function and an external reference read method is utilized in U.S. Pat. No. 6,545,906.

In an MRAM including a memory cell array, the state of which is switched between binary resistance values with a single kind of write pulse, the aforementioned conventional self-reference method cannot be employed because the aforementioned step (ii) cannot be performed.

As mentioned before, in an MRAM including a memory cell array in which the state is switched between binary resistance values with a single kind of write pulse, every time a write operation is performed, the data is reversed. For this reason, conventional self-reference read methods cannot be employed and the external reference read method is generally utilized. Therefore, the occurrence of read errors cannot be reduced, and it is not possible to produce a larger read signal.

SUMMARY OF THE INVENTION

The present invention is proposed in consideration of the aforementioned circumstances, and it is an object of the present invention to provide reduced read errors and a large read signal in a magnetoresistive random access memory in which the state is switched between binary resistance values with a single kind of write pulse.

A method of driving a magnetoresistive random access memory according to a first aspect of the present invention is a method of driving a magnetoresistive random access memory including memory cells, a state of which is switched between binary resistance values using a single kind of write pulses, the method including: selecting a memory cell; reading a resistance value, which is one of the binary resistance values, of the selected memory cell, the resistance value read being defined as a first resistance value; performing a first write operation on the selected memory cell using the write pulse to change the resistance value of the selected memory cell to the other of the binary resistance values; reading the other of the binary resistance values, which is defined as a second resistance value; comparing the second resistance value with the first resistance value, and determining data originally stored in the selected memory cell based on the comparison result; and performing a second write operation on the selected memory cell using the write pulse to change the second resistance value of the selected memory cell to the first resistance value.

The first and the second write operations may be performed on either at least one memory cell block including the selected memory cell or all the memory cells.

A method of driving a magnetoresistive random access memory according to a second aspect of the present invention is a method of driving a magnetoresistive random access memory including memory cells, a state of which is switched between binary resistance values using a single kind of write pulses, the method including: selecting a memory cell; reading a resistance value, which is one of the binary resistance values, of the selected memory cell, the resistance value read being defined as a first resistance value; performing a first write operation on the selected memory cell using the write pulse to change the resistance value of the selected memory cell to the other of the binary resistance values; reading the other of the binary resistance values, which is defined as a second resistance value; comparing the second resistance value with the first resistance value, and determining data originally stored in the selected memory cell based on the comparison result; and determining whether the data originally stored in the selected memory cell is the same as data to be written, and when they are the same, performing a second write operation on the selected memory cell using the write pulse.

Each memory cell of the magnetoresistive random access memory may include a magnetoresistance effect element having a magnetization pinned layer in which a magnetization direction is pinned, a recording layer having a structure in which a plurality of ferromagnetic layers are stacked with a nonmagnetic layer being provided between adjacent two ferromagnetic layers, an interaction between the ferromagnetic layers being antiferromagnetic and the magnetization directions of the ferromagnetic layers being changeable, and a tunnel barrier layer provided between the magnetization pinned layer and the recording layer.

A magnetoresistive random access memory according to a third aspect of the present invention is a magnetoresistive random access memory including memory cells, a state of which is switched between binary resistance values using a single kind of write pulses, the magnetoresistive random access memory including: a selection section configured to select a memory cell; a read section configured to read a resistance value, which is one of the binary resistance values, of the selected memory cell; a storage section configured to store the resistance value read by the read section; a write section configured to perform a first write operation using the write pulse to change the resistance value of the selected memory cell, which is read by the read section as a first resistance value, to the other of the binary resistance values, which is defined as a second resistance value; a comparison section configured to compare the second resistance value with the first resistance value; and a determination section configured to determine data originally stored in the selected memory cell based on a comparison result of the comparison section, the write section being configured to perform a second write operation on the memory cell on which the first write operation is performed using the write pulse to change the second resistance value of the selected memory cell back to the first resistance value.

A magnetoresistive random access memory according to a fourth aspect of the present invention is a magnetoresistive random access memory including memory cells, a state of which is switched between binary resistance values using a single kind of write pulses, the magnetoresistive random access memory including: a selection section configured to select a memory cell; a read section configured to read a resistance value, which is one of the binary resistance values, of the selected memory cell; a storage section configured to store the resistance value read by the read section; a write section configured to perform a first write operation using the write pulse to change the resistance value of the selected memory cell, which is read by the read section as a first resistance value, to the other of the binary resistance values, which is defined as a second resistance value; a comparison section configured to compare the second resistance value with the first resistance value; a first determination section configured to determine data originally stored in the selected memory cell based on a comparison result of the comparison section; and a second determination section configured to determine whether the data originally stored in the selected memory cell is the same as data to be written, the write section being configured to perform a second write operation on the memory cell on which the first write operation is performed using the write pulse when the data originally stored in the selected memory cell is the same as data to be written.

BRIEF DESCRIPTION OF THE DRAWINGS

FIGS. 7A and 7B are drawings explaining a magnetization reversal operation of a TMR element forming a memory cell of an MRAM used in an embodiment of the present invention.

FIGS. 8A and 8B are drawings showing the characteristic features of a switching magnetic field of a TMR element constituting a memory cell of an MRAM used in an embodiment of the present invention.

DESCRIPTION OF THE EMBODIMENTS

Hereinafter, a method of driving a magnetoresistive random access memory (hereinafter referred to as MRAM) according to an embodiment of the present invention will be described below with reference to the accompanying drawings.

Figure 4:
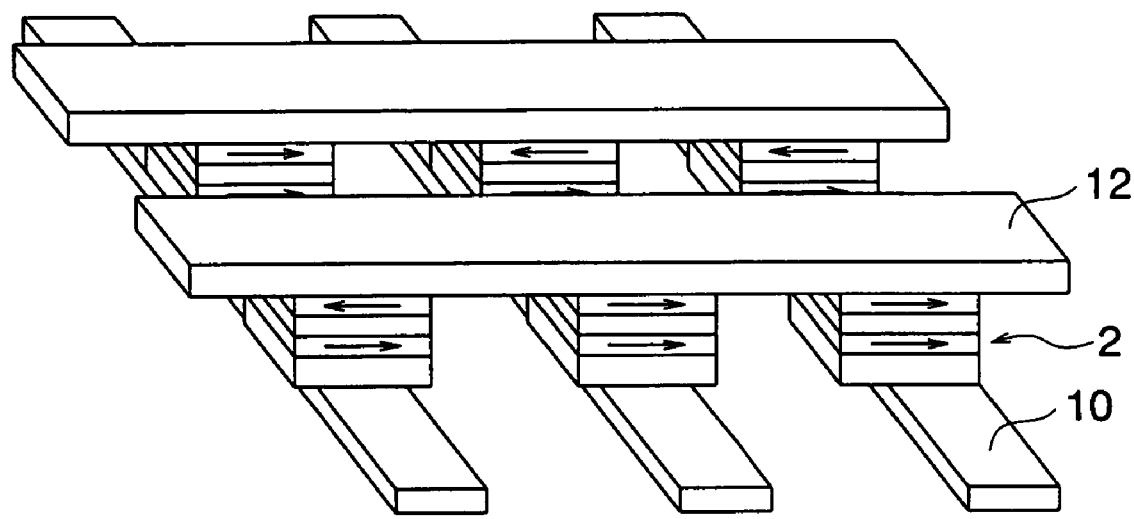
FIG. 4 is a perspective view schematically showing the structure of an MRAM used in an embodiment of the present invention.

First, the structure of an MRAM used in this embodiment will be described with reference to FIGS. 4 to 8B. As shown in FIG. 4, in the MRAM, a plurality of word lines 10 are formed on a silicon substrate on which a CMOS circuit is formed. A plurality of bit lines 12 are formed so as to substantially orthogonally intersecting the word lines 10. A memory cell is provided to each intersection of the word lines 10 and the bit lines 12, and a tunneling magnetoresistance effect element (hereinafter also referred to as TMR element) 2 is provided to each memory cell. The aforementioned COMS circuit includes transistors constituting a drive circuit of the MRAM, transistors for selecting the bit lines and word lines, and readout selection transistors of the memory cells.

Figure 5:
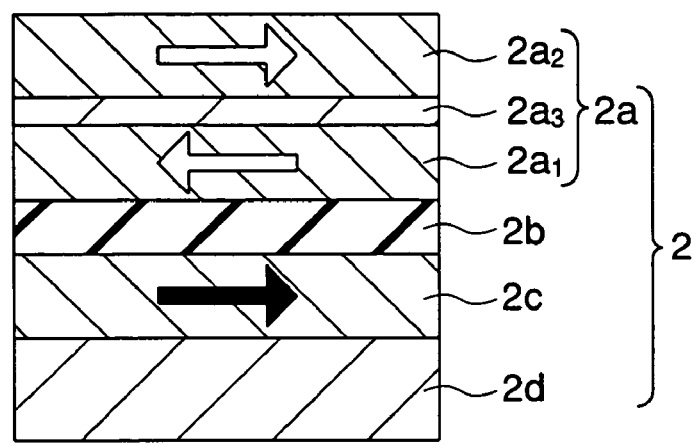
FIG. 5 is a sectional view schematically showing the structure of a TMR element forming a memory cell of an MRAM used in an embodiment of the present invention.
Figure 6:
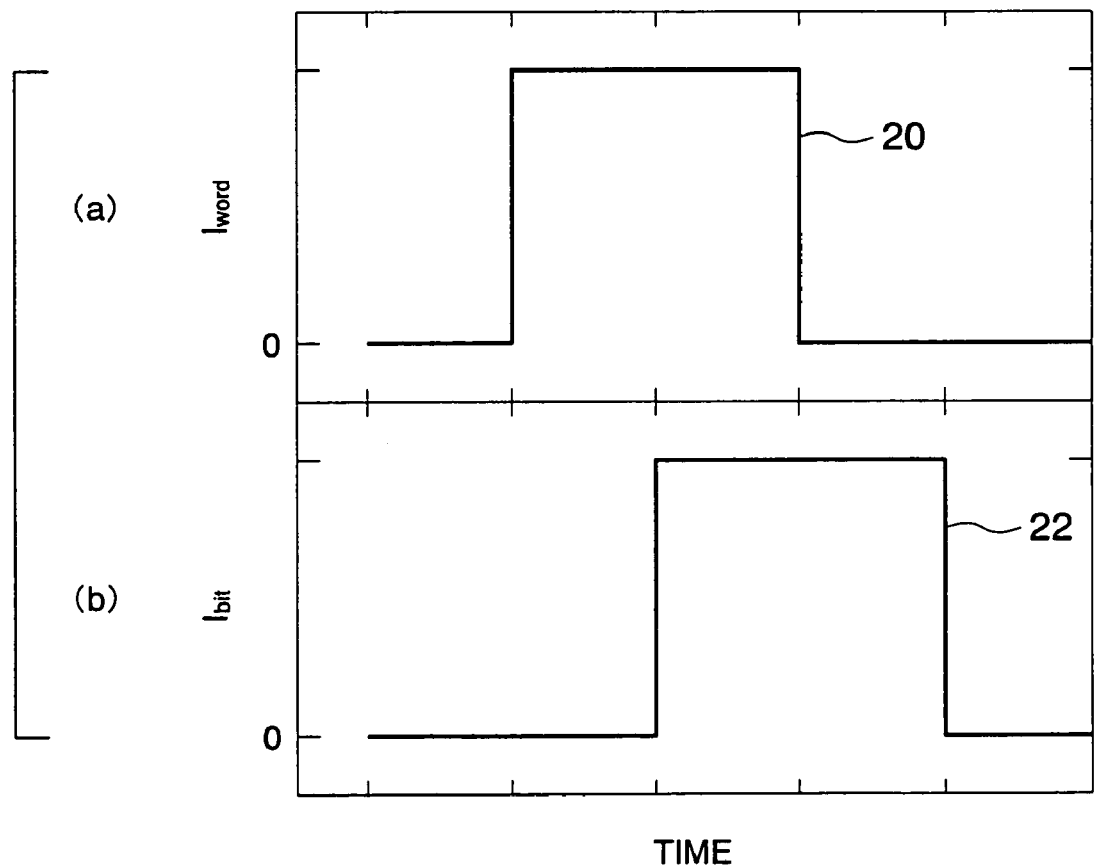
FIGS. 6(*a*) and 6(*b*) are waveform diagrams showing an example of write pulse used in an embodiment of the present invention.

As shown in FIG. 5, the TMR element 2 includes a recording layer 2*a*, a tunnel barrier layer 2*b*, a magnetization pinned layer 2*c* formed of a ferromagnet, and an antiferromagnetic layer 2*d*. The tunnel barrier layer 2*b* is provided between the recording layer 2*a* and the magnetization pinned layer 2*c*. The antiferromagnetic layer 2*d* is provided to a side of the magnetization pinned layer 2*c* opposite to the side of the tunnel barrier layer 2*b*, and pins the magnetization direction of the magnetization pinned layer 2*c* by magnetic exchange coupling. The recording layer 2*a* is a synthetic antiferromagnetic coupling recording layer, which includes a first recording layer $2a_1$ provided to the tunnel barrier layer 2*b* side and formed of a ferromagnetic material, a second recording layer $2a_2$ provided to a side of the first recording layer $2a_1$ opposite to the tunnel barrier layer 2*b* side and formed of a ferromagnetic material, and a nonmagnetic layer $2a_3$ provided between the first recording layer $2a_1$ and the second recording layer $2a_2$. The first recording layer $2a_1$ and the second recording layer $2a_2$ are coupled by antiferromagnetic coupling via the nonmagnetic layer $2a_3$. Although not shown in the drawings, the TMR element 2 includes an electrode layer, a base layer, etc. The layers constituting the TMR element 2 are formed by, e.g., a sputtering method. The easy magnetization axis of the TMR element 2 is inclined about 45 degrees relative to the word lines and the bit lines which orthogonally intersect with each other.

In this embodiment, the magnetization direction of the recording layer $2a$ of the TMR element 2 can be reversed by a synthetic magnetic field produced by an induced magnetic field generated by passing electrical currents through the word line and the bit line. It is possible to effectively reverse the magnetization direction of the recording layer $2a$ with a low write current by covering the word line and the bit line serving as write wiring lines with a soft magnetic material.

FIGS. 6(a) and 6(b) show pulse waveforms of write currents used in this embodiment. FIG. 6(a) shows a waveform of a write pulse 20 flowing through the word lines, and FIG. 6(b) shows a waveform of a write pulse 22 flowing through the bit lines. As can be understood from FIGS. 6(a) and 6(b), during a write operation, the write pulse 20 is passed through the word lines, and after the write pulse 20 attains an "H" level (unnecessarily at an instant when a half of the "H" level period has passed, as shown in FIGS. 6(a) and 6(b)), the write pulse 22 at the "H" level is passed through the bit lines. When the write pulse 20 attains the "L" level, the write pulse 22 is still "H" level (it is unnecessary that the write pulse 20 becomes the "L" level when a half of the "H" level period of the write pulse 22 has passed, as shown in FIGS. 6(a) and 6(b)). Typically, the "H" level period of the write pulse 20 is the same as that of the write pulse 22, and the write pulse 22 attains the "H" level after a half of the "H" level period of the write pulse 20 has passed. However, the timing is not limited to be half of the "H" level period.

When the write pulses shown in FIGS. 6(a) and 6(b) are passed through the word line and the bit line, the magnetization directions of the first recording layer $2a_1$ and the second recording layer $2a_2$ of the TMR element 2 are reversed. This will be described with reference to FIGS. 7A and 7B. FIGS. 7A and 7B are drawings explaining the magnetization reversal operation of the TMR element constituting the memory cell of the MRAM used in this embodiment. In each of FIGS. 7A and 7B, the horizontal axis is $H_{bit}$ axis showing the magnetic field induced by a bit line, and the vertical axis is $H_{word}$ axis showing the magnetic field induced by a word line. For example, as shown in FIG. 7A, in a case where the magnetization direction 31 of the first recording layer $2a_1$ is opposite to the magnetization direction 34 of the magnetization pinned layer $2c$, and the magnetization direction 32 of the second recording layer $2a_2$ is the same as the magnetization direction 34 of the magnetization pinned layer $2c$, i.e., when the data item stored in the recording layer 2 is "1", the magnetization directions of the first recording layer $2a_1$ and the second recording layer $2a_2$ can be reversed by passing the write pulses shown in FIGS. 6(a) and 6(b) to the word line and the bit line, and can be changed to the state of "0" shown in FIG. 7B. Similarly, when the data item stored in the recording layer 2 is "0", as shown in FIG. 7B, the magnetization directions of the first recording layer $2a_1$ and the second recording layer $2a_2$ can be reversed by passing the write pulses shown in FIGS. 6(a) and 6(b) through the word line and the bit line, and can be changed to the state of "1" shown in 7A. In FIGS. 7A and 7B, the magnetization directions of the first and second recording layers are at an angle of about 45 degrees from the $H_{bit}$ axis showing the magnetic field induced by the bit line and the $H_{word}$ axis showing the magnetic field induced by the word line. This is because that the direction of easy magnetization axis of the TMR element 2 is set to be at about 45 degrees from the word line and the bit line which cross at right angles each other. The detailed reason why the magnetization directions of the first recording layer $2a_1$ and the second recording layer $2a_2$ are reversed when the write pulses shown in FIGS. 6(a) and 6(b) are passed through the word line and the bit line is disclosed in U.S. Pat. No. 6,545,906.

In the MRAM used in this embodiment, the magnetization of the recording layer is reversed by a synthetic magnetic field produced by using the magnetic field generated by the bit line current and the magnetic field generated by the word line current. Accordingly, only the TMR element located at the intersection of the selected bit line and the selected word line is selected and written data to. As a result, when a recording operation is performed on a certain memory cell, the TMR elements of the memory cells located on the selected bit line and the TMR elements of the memory cells located on the selected word line are placed in a half selection state.

Figure 9B:
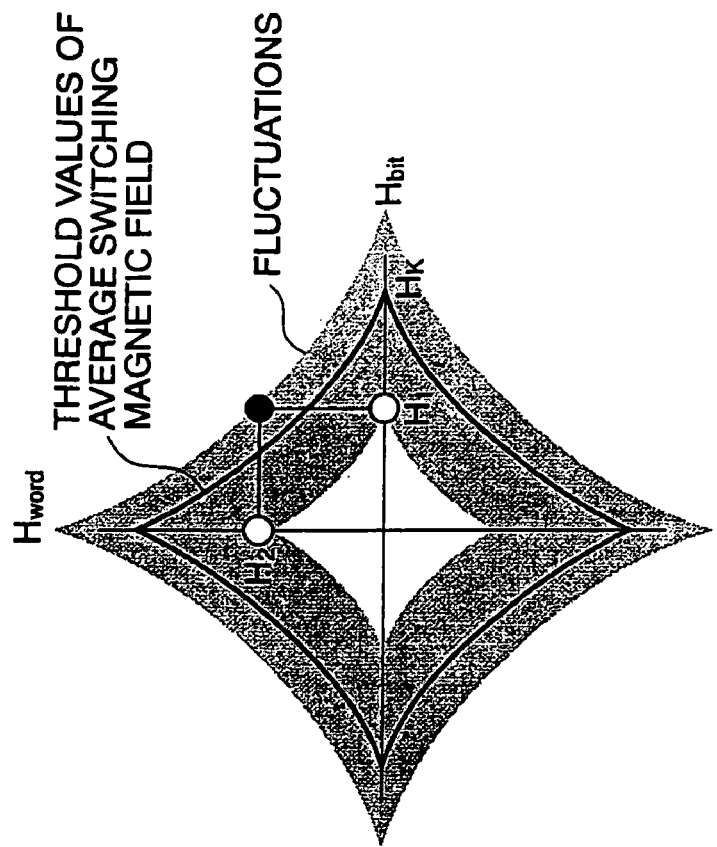
FIGS. 9A and 9B are drawings showing the characteristic features of a switching magnetic field of a conventional MRAM.
Figure 9A:
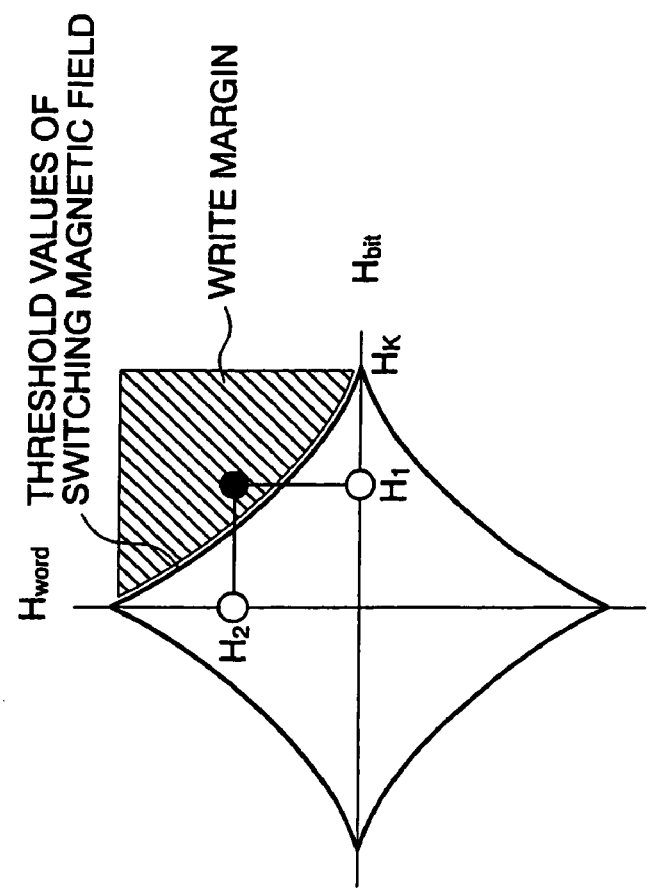

In a conventional MRAM, in order to prevent the memory cells placed in a half selection state from being erroneously written to, it is necessary to considerably suppress the fluctuations in switching magnetic fields among memory cells. The reason for this will be described with reference to FIGS. 9A and 9B. FIG. 9A shows an astroid curve of the threshold values of an ideal switching magnetic field. The magnetization direction of the recording layer of the TMR element is not changed by the synthetic magnetic field located within the astroid curve, but changed by the synthetic magnetic field located outside the astroid curve. When there is no fluctuation in the switching magnetic fields of the memory cells constituting the MRAM, the selection of the write memory cell is correctly performed as shown in FIG. 9A, and no write operation is performed on the memory cells in a half selection state. There is a wide write margin. However, in view of the structure of MRAMs, it has been difficult to suppress the fluctuations of switching magnetic fields in a number of memory cells. FIG. 9B shows the case where there are fluctuations in switching magnetic fields. When characteristic curves of the threshold values of the switching magnetic fields of a number of cells are superimposed with each other, the astroid curve has a width representing fluctuations, as shown in 9B. In such a case, data is not recorded to some cells even if they are selected. Or, some cells in a half selection state are written to when a magnetic field having a magnitude of $H_1$ or $H_2$ is applied.

FIGS. 8A and 8B show the write margins of the MRAM used in this embodiment. FIG. 8A is a characteristic diagram showing an ideal switching magnetic field having no fluctuation. In FIG. 8A, the characteristic curve 40 which is in parallel with neither the horizontal axis nor the vertical axis is a marginal curve showing that when a magnetic field greater than a synthetic magnetic field on the characteristic curve is applied to the TMR element, the magnetization directions of the first recording layer and the second recording layer become the same. That is to say, this characteristic curve is defined by an exchange coupling energy J produced between the first recording layer and the second recording layer and an anisotropic magnetic field $H_k$. In the MRAM used in this embodiment, the characteristic curve of the switching magnetic field does not intersect with the $H_{bit}$ axis representing the magnetic field induced by the bit line and the $H_{word}$ axis representing the magnetic field induced by the word line. Accordingly, even if there are fluctuations in anisotropic magnetic field of the recording layer or exchange coupling energy J between the first recording layer and the second recording layer, as shown in FIG. 8B, in principle, a phenomenon where data is written to a memory cell in a half selection state is unlikely to occur. Even if there are fluctuations in anisotropic magnetic field or exchange coupling energy as shown in FIG. 8B, it is possible to have sufficient write margin by slightly increasing the exchange coupling energy. Thus, the MRAM of this embodiment is robust to fluctuations in switching magnetic fields of the memory cell, i.e., erroneous writing is unlikely to occur in the MRAM of this embodiment. This is in contrast to the case of a conventional MRAM where the write margin becomes very narrow when there are some fluctuations in the characteristic curve of the threshold values of the switching magnetic field, as shown in FIG. 9B.

In this embodiment, as the exchange coupling energy J between the first recording layer and the second recording layer is increased, the write magnetic field increases. Generally, it is preferable that write magnetic field be as small as possible. When the size of a TMR element is about 240×480 nm$^2$, for example, it is possible to suppress the probability of the occurrence of erroneous writing so as to be practically effective and to decrease the write current by suppressing the fluctuations in anisotropic magnetic field so that a standard deviation σ is 5% or less, and by setting the exchange coupling energy J to be about 0.01 erg/cm$^2$ to 0.02 erg/cm$^2$.

(Read Method)

Next, the drive method of this embodiment will be described below. First, a read method will be described with reference to FIG. 1, which is a flow chart showing a read process of a drive method according to this embodiment. The MRAM used in this embodiment is composed of a memory cell array, each memory cell having either of binary resistance values which are alternately switched by the same kind of write pulses shown in FIGS. 6(a) and 6(b). Accordingly, after being subjected to two write operations, the state of data is returned to the original state. The present inventors have utilized this characteristic feature in a read method of a self-reference method.

Figure 1:
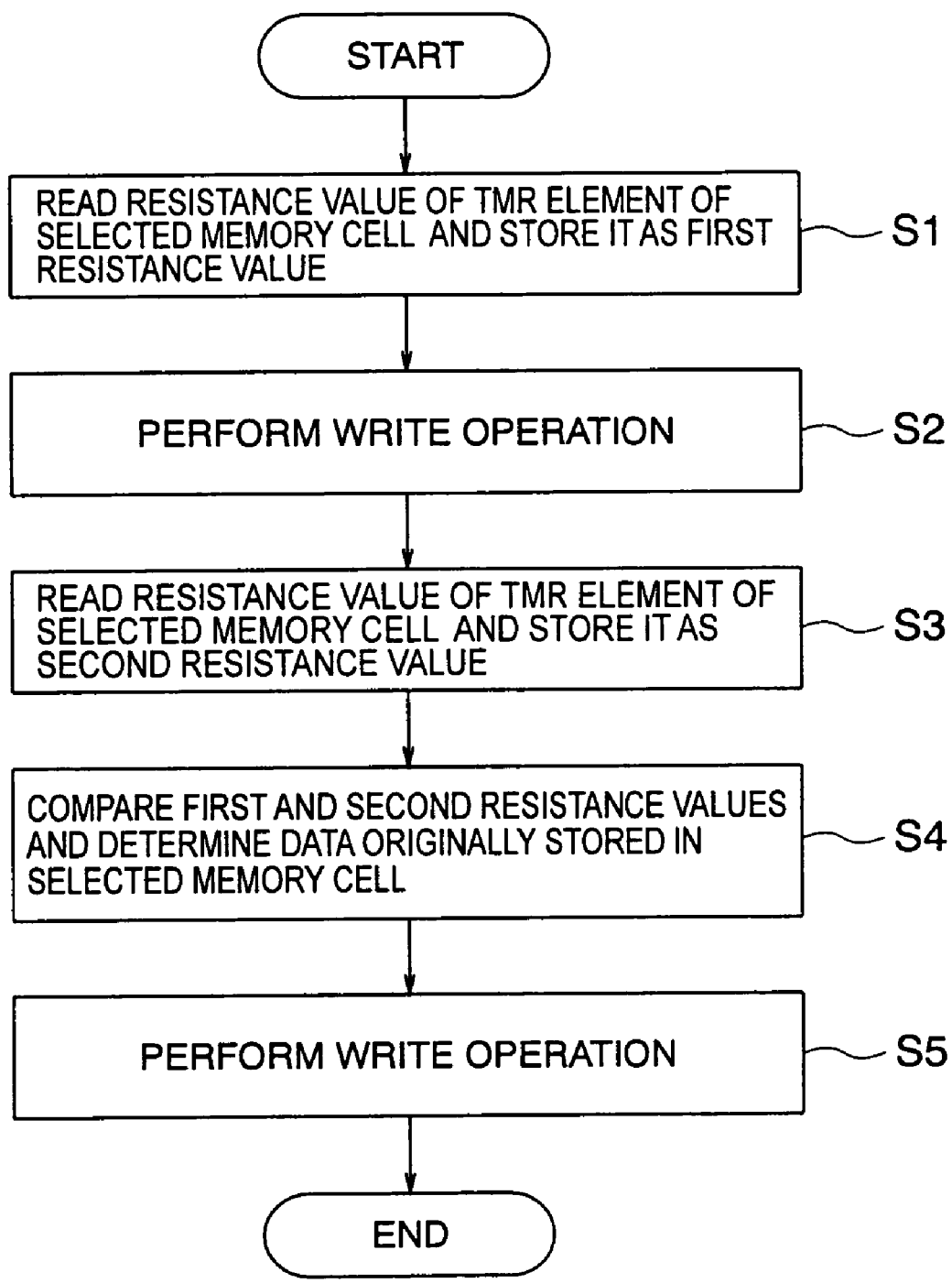
FIG. 1 is a flow chart showing a read process of a read method according to an embodiment of the present invention.

First, as shown in step S1 of FIG. 1, a first read operation is performed. That is to say, the resistance value of the TMR element of the selected memory cell is read and stored in a form of electrical current or voltage as a first resistance value. In an actual circuit configuration, a first capacitor in a read circuit, for example, stores the voltage.

Next, as shown in step S2 of FIG. 1, a write operation is performed. The write operation can be performed only on the selected memory cell, or on all the memory cells in the MRAM since another write operation is performed in step S5 of FIG. 1, which will be described later. Furthermore, the write operation can be performed on a memory cell block or memory cell blocks including the selected memory cell. The unit of memory cell block can be, e.g., 4 kbit, 8 kbit, 16 kbit, 32 kbit, or 64 kbit. It is possible to curb the power consumption at the time of a write operation by performing the write operation on the memory cell block/blocks.

Then, as shown in step S3 of FIG. 1, a second read operation is performed. That is to say, the resistance value of the TMR element of the selected memory cell is read and stored as a second resistance value. In the actual circuit configuration, a second capacitor of the read circuit, for example, stores the voltage.

Next, as shown in step S4 of FIG. 1, the second resistance value is compared with the first resistance value. Based on the comparison result, the data item originally recorded in the selected memory cell is determined. In this determination step, when the second resistance value is larger than the first resistance value, the data item originally stored is determined to be "0", and when it is smaller, the data item originally stored is determined to be "1".

Subsequently, as shown in step S5 of FIG. 1, a write operation is performed.

After the aforementioned series of steps, the storage state of the TMR element is returned to the original state.

Figure 2A:
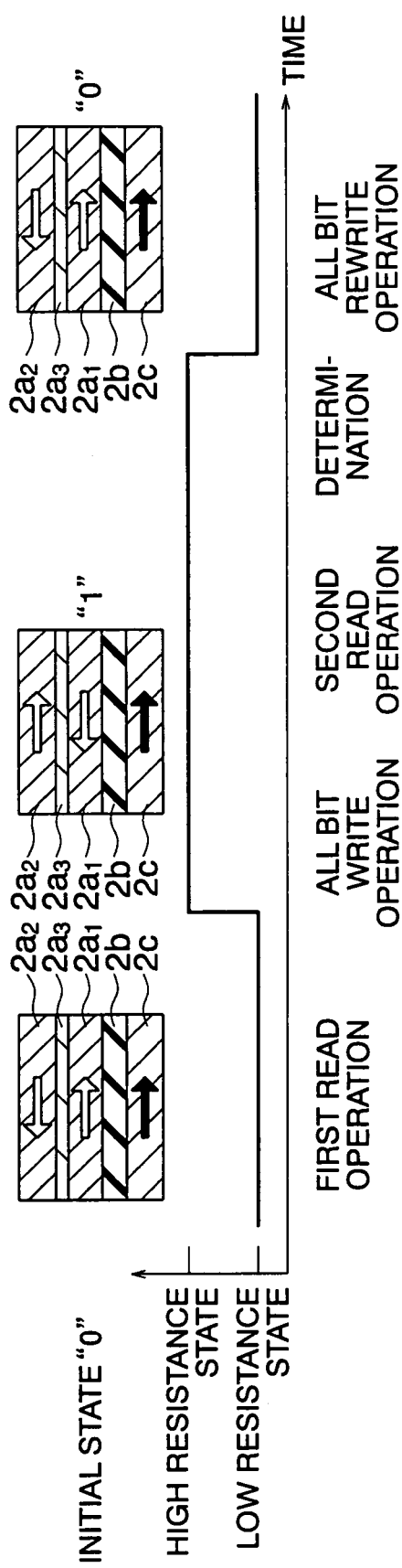
FIGS. 2A and 2B show the storage states of a TMR element read by using the read method shown in FIG. 1.
Figure 2B:
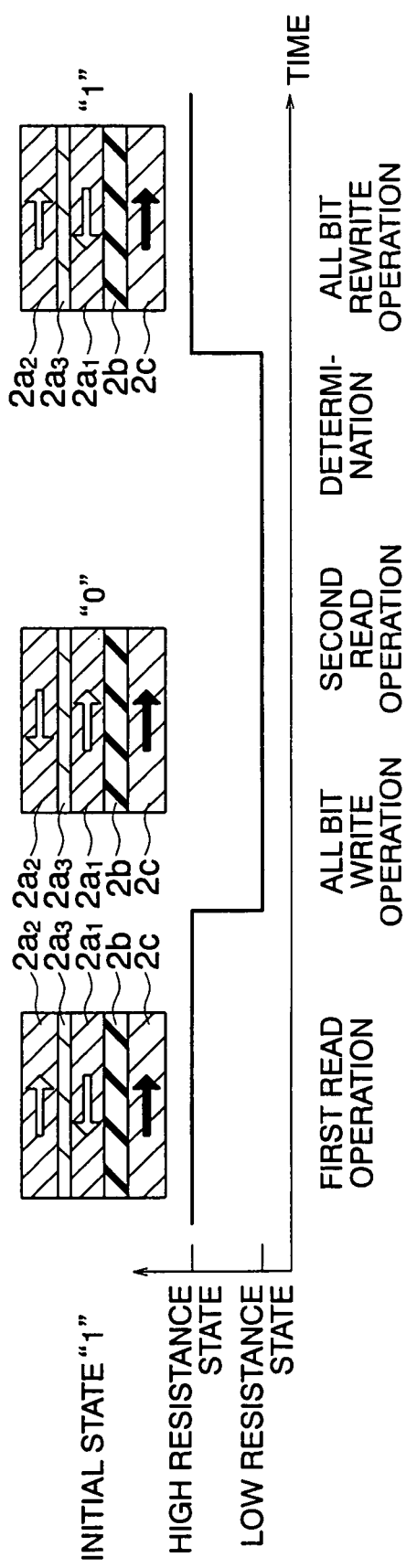

FIG. 2A shows the state of a TMR element when the aforementioned read process is applied to the case where the initial state of the data item stored is "0", and FIG. 2B shows the state of a TMR element when the aforementioned read process is applied to the case where the initial state of the data item stored is "1".

Figure 10:
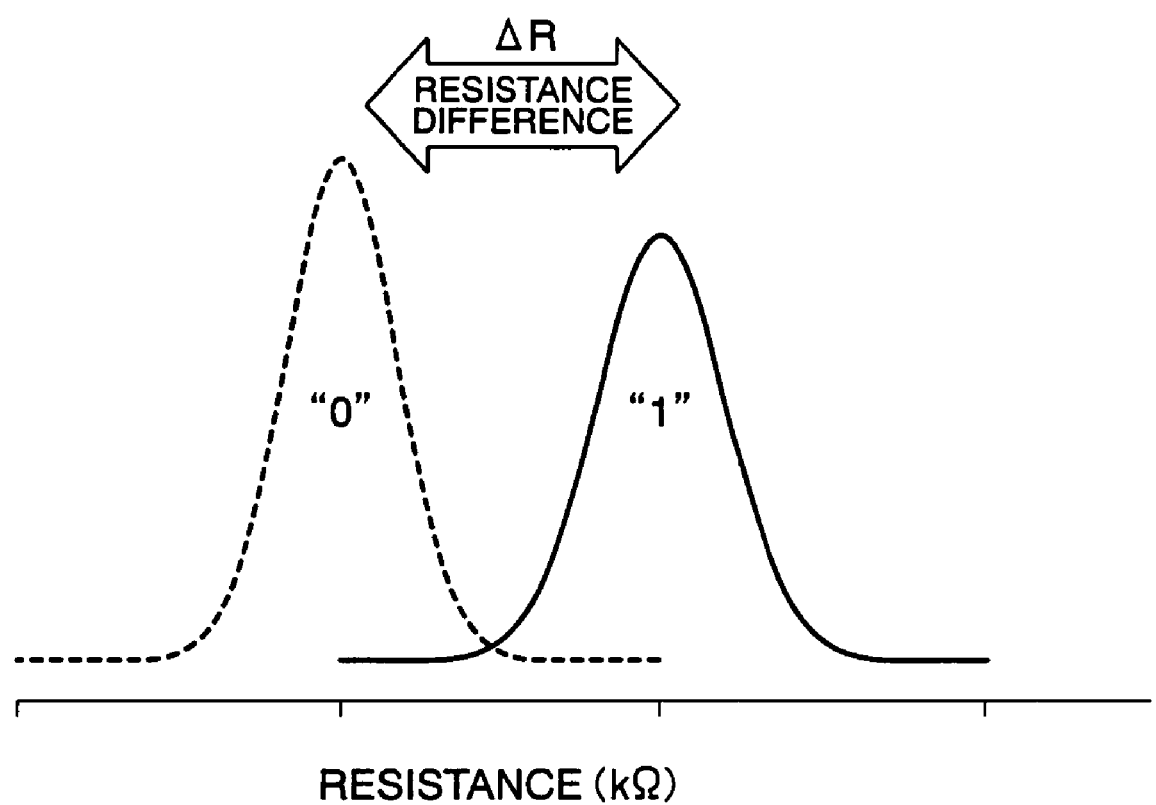
FIG. 10 is a drawing explaining characteristic features of a self-reference read method according to an embodiment of the present invention.

In this embodiment, the first and second resistance values always different each other in step S4 of FIG. 1, and the absolute value of the difference corresponds to the resistance difference ΔR between "0" and "1" shown in FIG. 10. Accordingly a signal amount twice as large as the signal amount (ΔR/2) in an external reference method can be obtained. In the read method according to this embodiment, even in a case where the tails of the resistance distributions of the cases "0" and "1" overlap each other, read errors can be decreased as compared with the external reference method. FIG. 10 is a graph showing the distributions of resistance values of all the memory cells in the "0" state and the "1" state, the memory cells constituting the MRAM used in this embodiment.

In a read operation of self-reference method for a conventional MRAM, of which a recording layer does not have a synthetic structure, the resistance difference described in the descriptions of step (iv) of the conventional techniques is either 0 or −ΔR. In contrast, in the read operation of the self-reference method according to this embodiment, the resistance difference in step S4 of FIG. 1 is either +ΔR or −ΔR. Thus, it is possible to have a signal value far greater than that of a conventional MRAM.

As described above, in the read method according to this embodiment, it is possible to have a signal value larger than that of a conventional MRAM. Since the recording layer of the MRAM used in this embodiment has a synthetic structure, it is possible to have a sufficient write margin, thereby preventing the occurrence of read errors.

(Write Method)

Next, a write method will be described with reference to FIG. 3, which is a flow chart showing a write process of the drive method according to this embodiment. Since the MRAM used in this embodiment is composed of a memory cell array, of which memory cells are alternately switched between binary resistance values by the same kind of write pulses, when the data is rewritten, it is necessary to first read the original data item stored, and then to perform a write operation based on the original data item. In the self-reference method according to this embodiment, it is possible to simplify the write process. The write process of this embodiment will be described below.

Figure 3:
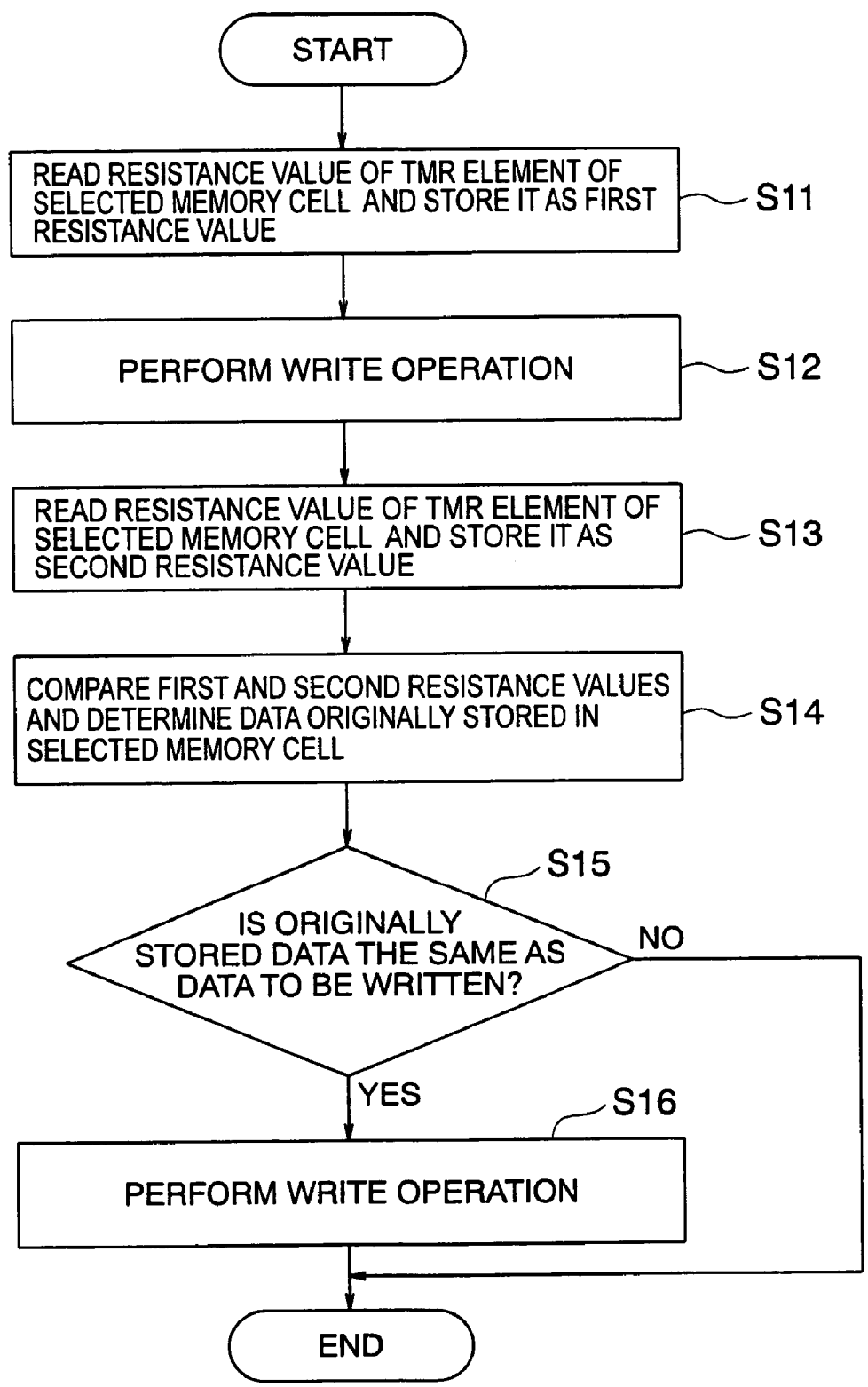
FIG. 3 is a flow chart showing a write process of a write method according to an embodiment of the present invention.

First, as shown in step S11 of FIG. 3, a first read operation is performed. That is to say, the resistance value of the TMR element of the selected memory cell is read and stored in a form of electrical current or voltage as a first resistance value. In an actual circuit configuration, a first capacitor in a read circuit, for example, stores the voltage.

Subsequently, as shown in step S12 of FIG. 3, a write operation is performed on the selected memory cell.

Next, as shown in step S13 of FIG. 3, a second read operation is performed. That is to say, the resistance value of the TMR element of the selected memory cell is read and stored as a second resistance value. In the actual circuit configuration, a second capacitor of the read circuit, for example, stores the voltage.

Thereafter, as shown in step S14 of FIG. 3, the second resistance value is compared with the first resistance value. Based on the comparison result, the data item originally recorded in the selected memory cell is determined. In this determination step, when the second resistance value is larger than the first resistance value, the data item originally stored is determined to be "0", and when it is smaller, the data item originally stored is determined to be "1".

Next, as shown in step S15 of FIG. 3, whether or not the data item originally stored and the data item to be written are the same is determined, and if they are not the same, the write operation is terminated. If they are the same, the process proceeds to step S16 of FIG. 3, and a write operation is performed on a selected memory cell.

In this process, the final write operation of step S16 in FIG. 3 serves as the operation to write new data. In this manner, it is possible to complete the write operation effectively in a short time.

This write process can be performed on either one memory cell or a memory cell block including a plurality of memory cells. In the latter case, steps S11 to S15 are equally performed on all the memory cells included in the target memory cell block. Step S16 is performed on only the memory cells in the target memory cell block for which the determination result after step S15 is YES.

The read method and the write method according to this embodiment are effective for both an MRAM having a selection transistor for each memory cell and so-called "cross point type" MRAM.

As described above, in the MRAM used in this embodiment, it is possible to generate a sufficiently large read signal even if the MR ratio is low or the resistance fluctuations are large. The aforementioned process is simple and fast since according to the MRAM read method of the first aspect of the present invention, it is not necessary to perform a rewrite operation based on the evaluation of a read operation.

Furthermore, in this embodiment, the absolute value of a change in resistance at the time of a read operation is the resistance difference $\Delta R$ between "0" and "1". Accordingly, it is possible to generate a signal amount twice as large as the signal amount ($\Delta R/2$) of the external reference method.

Moreover, in this embodiment, when the tails of the resistance distributions of "0" and "1" overlap each other, it is possible to decrease the degree of read errors as compared to the case of the external reference method.

In the MRAM read method of the conventional self-reference method, the resistance difference is either 0 or $-\Delta R$. In contrast, in the read method of the self-reference method of this embodiment, the resistance difference is either $+\Delta R$ or $-\Delta R$. Accordingly, it is possible to generate a signal having a larger signal amount than in the conventional cases.

Although the read method and the write method according to this embodiment have been described using an example of an MRAM including a magnetoresistance effect element, the recording layer thereof having a synthetic structure shown in FIG. 5, the present invention can be applied to an MRAM including a memory cell array in which the resistance value of each cell changes between binary resistance values by the same kind of write pulses. Accordingly, it is possible to apply the present invention to an MRAM including a magnetoresistance effect element having a recording layer with a structure of stacking three or more ferromagnetic layers with a nonmagnetic layer being inserted between adjacent two of them, the ferromagnetic layers being coupled by antiferromagnetic coupling.

Conventionally, an external reference method using an external reference resistance value is generally employed as a read method since an external reference resistance can be easily generated by using a TMR element in an array. In this external reference method, an external reference resistance of 4 bits per 64 bits of storage cell is used. In this case, however, there is a problem in that since the number of memory cells used for storage is decreased, the ratio of the memory cell used for storage relative to the chip area is decreased. In contrast to this, in the read method of the self-reference method according to this embodiment, since no external reference resistance is necessary, there is an advantage in that the ratio of memory cells with respect to the chip area can be increased.

Next, the structure of a drive circuit realizing the read method and the write method according to this embodiment will be described with reference to FIGS. 11 to 13.

Figure 11:
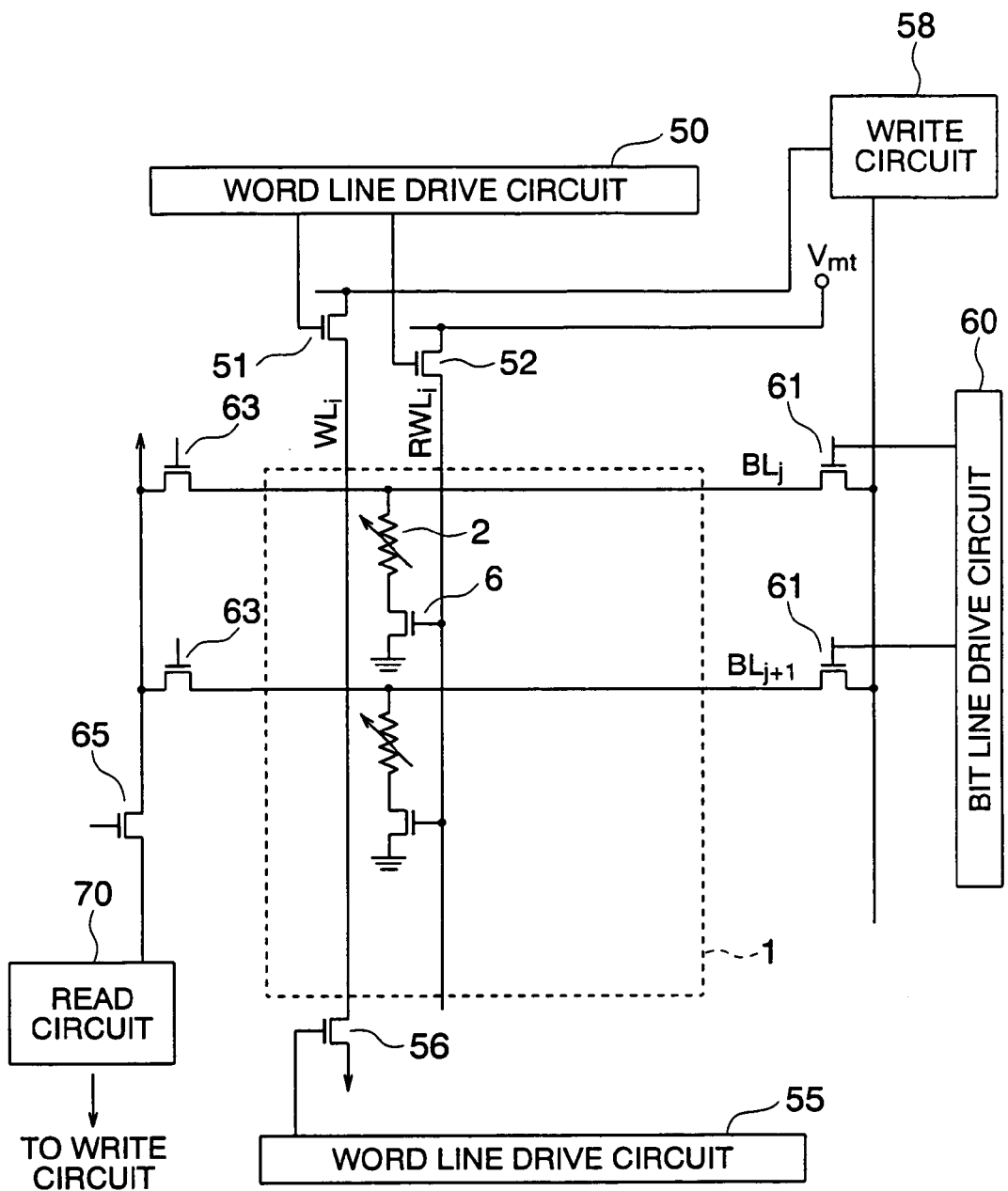
FIG. 11 is a block diagram schematically showing the structure of an MRAM used in an embodiment of the present invention.

FIG. 11 is a block diagram showing an example of the structure of a main part of an MRAM used in this embodiment. A memory cell array 1 includes memory cells arranged to form an array. Each memory cell includes a TMR element 2 and a memory selection transistor 6. A write word line $WL_i$ and a read word line $RWL_i$ are located to be adjacent to the i-th (i=1, ...) TMR element 2. One end of the write word line $WL_i$ is connected to a write circuit 58 via a row selection transistor 51, and the other end thereof is connected to a current sinker via a row selection transistor 56. A gate of the row selection transistor 51 is connected to a word line drive circuit 50 including a row decoder, and a gate of the row selection transistor 56 is connected to a word line drive circuit 55 including a row decoder. "Current sinker" means a circuit absorbing a current generated at a current generator circuit (not shown in the drawing) included in the write circuit 58. One end of the read word line RWLi is connected to a power supply Vmt via a row selection transistor 52.

A bit line $BL_j$ is provided along a j-th (j=1, ...) TMR element 2 of the memory cell array 1. One end of the bit line $BL_j$ is connected to the write circuit 58 via a column selection transistor 61, and the other end thereof is connected to a read circuit 70 via a column selection transistor 63 and a read selection transistor 65. Furthermore, the bit line $BL_j$ is connected to a current sinker via a column selection transistor 63. The gates of the column selection transistors 61 and 63 are connected to a bit line drive circuit 60. A read circuit 70 detects a voltage of an end at the bit line side of the TMR element 2 of a selected memory cell. At the time of a write operation, the current generator circuit in the write circuit 58 sends a predetermined current pulse (for example, a current pulse shown in FIG. 6(a) or 6(b)) to a write word line via the row selection transistor 51, and to a bit line via the column selection transistor 61. At the time of a read operation, the current generator circuit sends a read current to a bit line via the column selection transistor 61. The read selection transistor 65 is turned ON only at the time of a read operation.

When data is written to a memory cell of i-th column and j-th line, the column selection transistors 61 and 63 connected to the bit line $BL_j$ are turned ON by the bit line drive circuit 60, and the row selection transistors 51 and 56 connected to the write word line $WL_i$ are turned ON by the word line drive circuits 50 and 55. At this time, the write operation is performed by passing, e.g., the current pulses $I_{word}$ and $I_{bit}$ shown in FIGS. 6(a) and 6(b) to the write word line $WL_i$ of the i-th column and the bit line $BL_j$ of the j-th line from the aforementioned current generator circuit.

When data is read from the memory cell at the i-th column and the j-th line, the column selection transistors 61 and 63 connected to the bit line $BL_j$ are turned ON by the bit line drive circuit 60, and the row selection transistor 52 connected to the read word line $RWL_i$ is turned ON by the word line drive circuit 50. In this manner, the memory selection transistor 6 is turned ON. At this time, the read selection transistor 65 is also turned ON. Subsequently, an electrical current flows through the TMR element 2 of the selected memory cell via the bit line BLi, and the potential of the TMR element 2 at the bit line side changes a value in response to the resistance value of the TMR element 2. The write circuit 58 includes a determination section performing the determination of step S15 in FIG. 3. The read circuit 70 includes a determination section performing the determination of step S4 of FIG. 1 and step S14 of FIG. 3.

Figure 12:
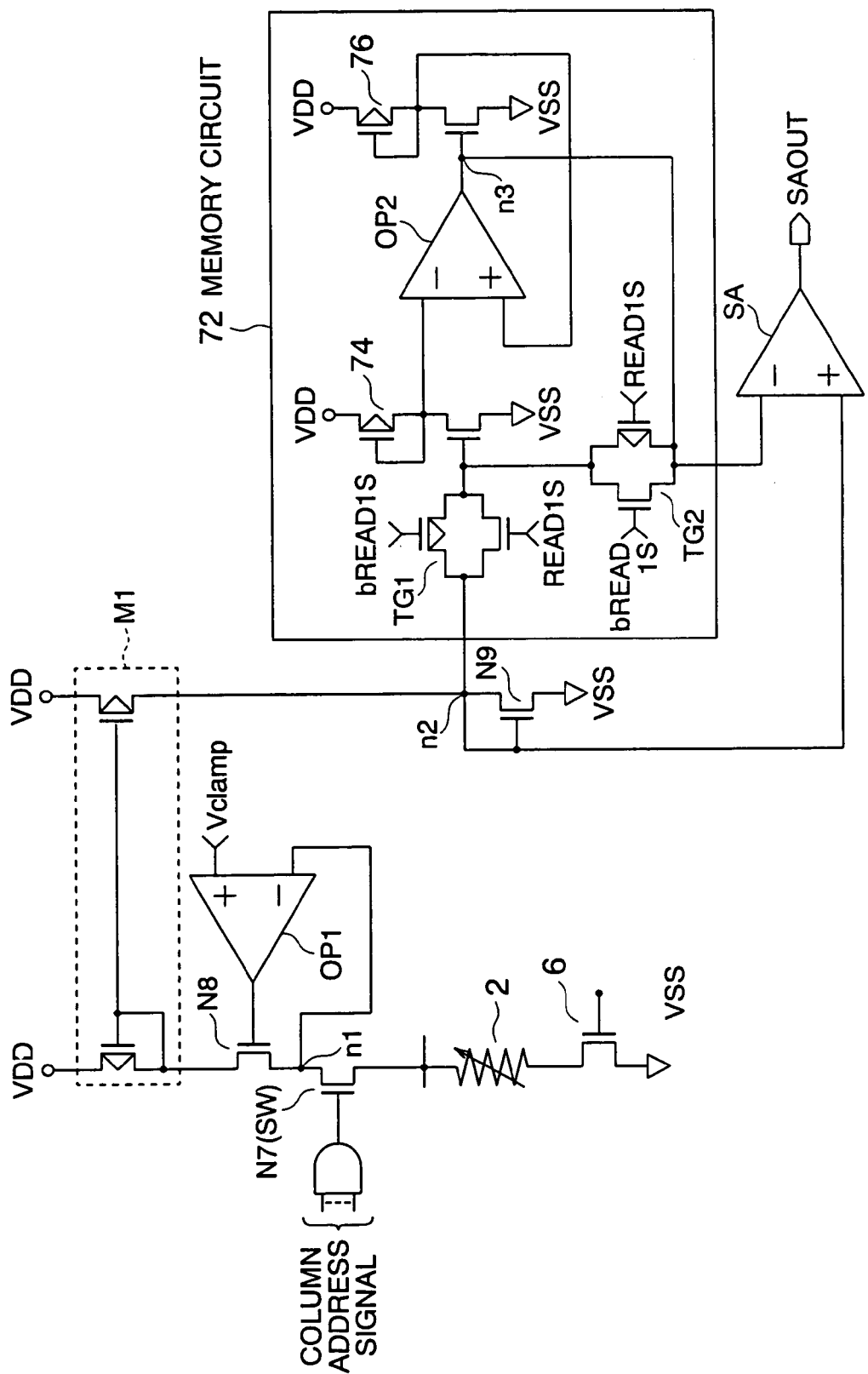
FIG. 12 is a circuit diagram showing a specific example of a read circuit used in an embodiment of the present invention.

Next, an example of a specific circuit configuration of the read circuit 70 is shown in FIG. 12.

One end of the TMR element 2 is grounded via the read selection transistor 6, and the other end thereof is connected to a node n1 via an n-channel MOS transistor N7 (SW) serving as a column selection switch (corresponding to the column selection transistor 63 of FIG. 11). The potential of the node n1 is set at a clump potential Vclamp by a clump circuit. The clump circuit is composed of an operational amplifier OP1 and an n-channel MOS transistor N8. The n-channel MOS transistor N8 is located between the node n1 and a current mirror circuit M1. The operational amplifier OP1 controls the gate potential of the n-channel MOS transistor N8 so that, for example, the potential of the node n1 becomes equal to the clump potential Vclamp.

A function of the clump circuit is to adjust the voltage across the TMR element 2. When a ground voltage is given to one end of the TMR element 2, for example, if the potential of the other end of the TMR element 2 were to become too high, the MR ratio of the TMR element 2 would become lower. This means that a difference between the resistance value of the TMR element in the "1" state and the resistance value of the TMR element in the "0" state would become small. That is to say, the margin for determining whether data is "1" or "0" at the time of a read operation would become small. In order to avoid this, in this embodiment, the potential of the other end of the TMR element 2 is adjusted, i.e., the voltage across the TMR element 2 is adjusted, by using a clump circuit so that the MR ratio of the TMR element 2 does not become small.

The current mirror circuit M1 has a function of passing a current, which is equal to the read current flowing through the TMR element 2, through the n-channel MOS transistor N9. The potential of a node n2 (for example, initial data) of the n-channel MOS transistor N9 is stored in a memory circuit 72 via a transfer gate circuit TG1.

The ON/OFF states of the transfer gate circuit TG1 are controlled by control signals READ1S and bREAD1S. The control signal READ1S is the signal that becomes "H" at the first read operation (the reading of initial data). The control signal bREAD1S a reversal signal having a value opposite to the value of the control signal READ1S.

When the control signal READ1S is at "H" (first read operation) the potential of the node n2 is inputted to an inverter circuit 74 via the transfer gate circuit TG1. An output signal from the inverter circuit 74 is inputted to a minus side input terminal of the operational amplifier OP2. An output signal from the operational amplifier OP2 is inputted to an inverter circuit 76, and an output signal from the inverter circuit 76 is inputted to a plus side input terminal of the operational amplifier OP2. The operational amplifier OP2 controls, e.g., the gate potential of an n-channel MOS transistor in the inverter circuit 76 so that an input potential to be inputted to the minus side input terminal thereof becomes equal to an input potential inputted to the plus side input terminal. As a result, the current flowing through the inverter circuit 76 receiving the output signal of the operational amplifier OP2 serves as the initial data (cell data).

A transfer gate circuit TG2 is connected between the output terminal of the operational amplifier OP2 and the input terminal of the inverter circuit 74. After the first read operation, the control signal READ1S becomes "L", and the control signal bREAD1S becomes "H". As a result, the initial data is latched in the memory circuit 72.

A plus side input terminal of a sense amplifier SA is connected to the node n2, and a minus side input terminal thereof is connected to an output terminal n3 of the operational amplifier OP2. When the data of the selected TMR element is judged, the sense amplifier SA compares the potential of the node n2 with the potential of the output terminal n3 of the operational amplifier OP2.

That is to say, the potential of the node n1 represents the result of the second read operation (comparison data), and the potential of the output terminal n3 of the operational amplifier OP2 represents the result of the first read operation (initial data). The output SAOUT or the like of the sense amplifier SA is transferred to the write circuit 58 (FIG. 11), thereby performing a write operation. The write circuit 58 drives the word line drive circuits 50 and 55 and the bit line drive circuit 60 so as synchronize with the operation of the write circuit 58.

Figure 13:
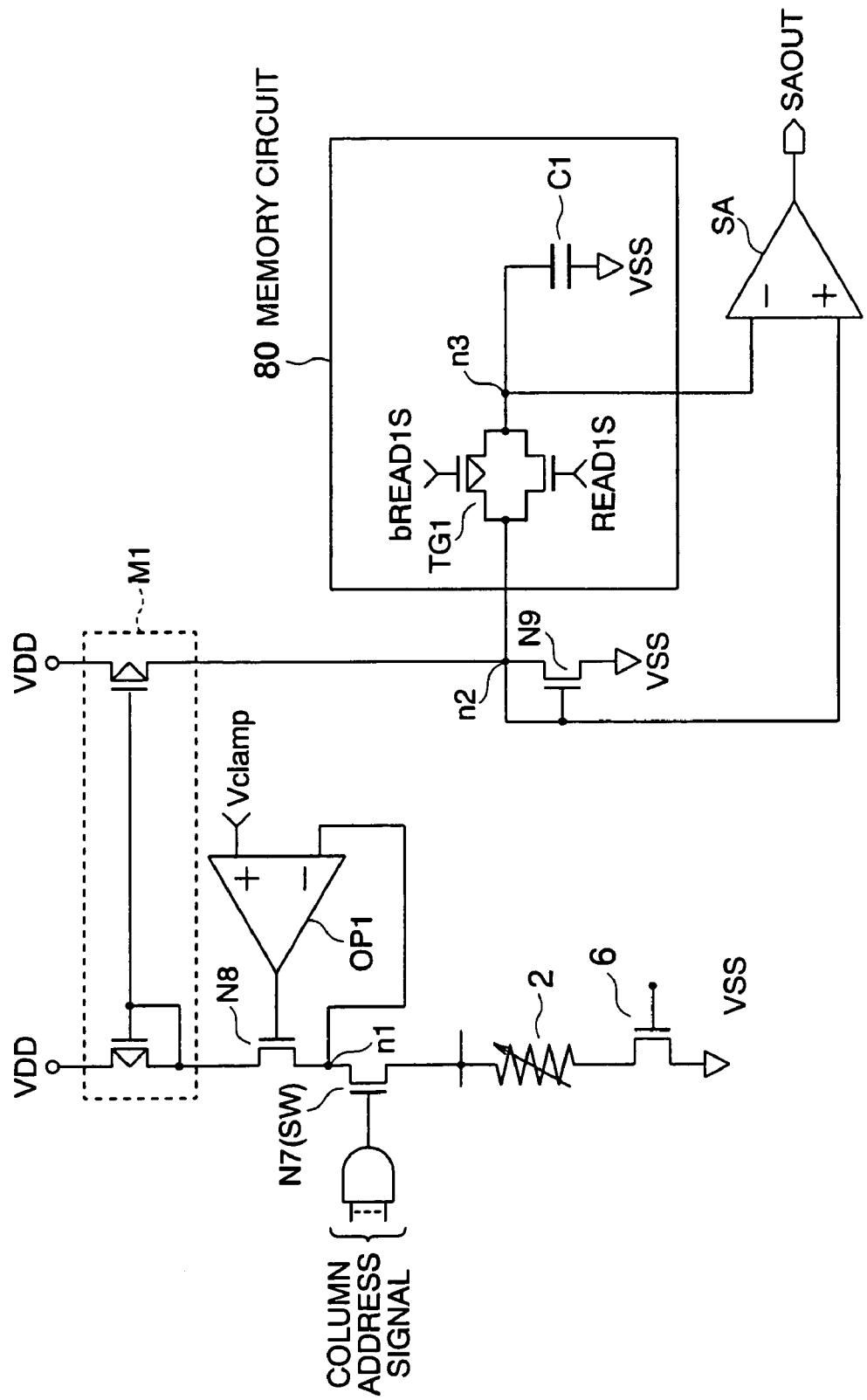
FIG. 13 is a circuit diagram showing another specific example of a read circuit used in an embodiment of the present invention.

Next, FIG. 13 shows another example of a specific circuit configuration of the read circuit 70. The read circuit shown in FIG. 13 is a modification of the read circuit shown in FIG. 12, replacing the memory circuit 72 of FIG. 12 with a memory circuit 80. The memory circuit 80 has a structure in which the transfer gate TG2, the inverter circuits 74 and 76, and the operational amplifier OP2 are removed from the memory circuit 72 shown in FIG. 12, and a capacitor C1 is added thereto.

In the read circuit shown in FIG. 13, the potential (initial data) of the node n2, for example, is dynamically stored in the capacitor C1. Accordingly, it is necessary to shorten, for example, the period between the first read operation and the second read operation as compared with the period the capacitor C1 retains the stored data.

As has been fully studied and analyzed in the art of DRAM (dynamic random access memory), the period the capacitor C1 keeps storing data is, e.g., a few milliseconds. Accordingly, when the period between the first read operation and the second read operation is shorter than a few milliseconds, it is possible to use the capacitor C1 in the memory circuit 80.

In FIGS. 12 and 13, the read circuit 70 includes a memory circuit, a comparison circuit (sense amplifier or the like), etc. However, these circuits can be provided outside the read circuit 70, e.g., as peripheral devices of the read circuit 70, the word line drive circuits 50 and 55, and the bit line drive circuit 60, etc.

As described above, according to the embodiments of the present invention, it is possible to generate a large read signal with few read errors.

It should be noted that the present invention is not limited to the aforementioned embodiments, but can be modified when being carried out without departing from the scope of the appended claims. Furthermore, it is possible to appropriately combine the constituent features of the aforementioned embodiments to provide various inventions. For example, some constituent features can be deleted from all the constituent features of an embodiment. Moreover, the constituent features included in different embodiments can be appropriately combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method of driving a magnetoresistive random access memory including memory cells, a state of which is switched between binary resistance values using a single set of write pulses, the method comprising:
   selecting a memory cell;
   reading a resistance value, which is a first value of the binary resistance values, of the selected memory cell, the resistance value read being defined as a first resistance value;
   performing a first write operation on the selected memory cell using a single set of first write pulses to change the resistance value of the selected memory cell to a second value of the binary resistance values;
   reading the second value of the binary resistance values, which is defined as a second resistance value;
   comparing the second resistance value with the first resistance value, and determining data originally stored in the selected memory cell based on the comparison result; and
   performing a second write operation on the selected memory cell using second write pulses having a same polarity as a polarity of the first write pulses to change the second resistance value of the selected memory cell to the first resistance value.

2. The method of driving a magnetoresistive random access memory according to claim 1, wherein the first and the second write operations are performed on either at least one memory cell block including the selected memory cell or all the memory cells.

3. The method of driving a magnetoresistive random access memory according to claim 1, wherein each memory cell of the magnetoresistive random access memory includes a magnetoresistance effect element having a magnetization pinned layer in which a magnetization direction is pinned, a recording layer having a structure in which a plurality of ferromagnetic layers are stacked with a nonmagnetic layer being provided between adjacent two ferromagnetic layers, an interaction between the adjacent two ferromagnetic layers being antiferromagnetic and the magnetization direction of the adjacent two ferromagnetic layers being changeable, and a tunnel barrier layer provided between the magnetization pinned layer and the recording layer.

4. The method of driving a magnetoresistive random access memory according to claim 3, wherein each memory cell further includes a selection transistor selecting the magnetoresistance effect element.

5. A method of driving a magnetoresistive random access memory including memory cells, a state of which is switched between binary resistance values using a single kind of write pulses, the method comprising:
   selecting a memory cell;
   reading a resistance value, which is a first value of the binary resistance values, of the selected memory cell, the resistance value read being defined as a first resistance value;
   performing a first write operation on the selected memory cell using a single set of first write pulses to change the resistance value of the selected memory cell to a second value of the binary resistance values;
   reading the second value of the binary resistance values, which is defined as a second resistance value;
   comparing the second resistance value with the first resistance value, and determining data originally stored in the selected memory cell based on the comparison result; and
   determining whether the data originally stored in the selected memory cell is the same as data to be written, and when they are the same, performing a second write operation on the selected memory cell using second write pulses having a same polarity as a polarity of the first write pulses.

6. The method of driving a magnetoresistive random access memory according to claim 5, wherein the first and the second write operations are performed on either at least one memory cell block including the selected memory cell or all the memory cells.

7. The method of driving a magnetoresistive random access memory according to claim 5, wherein each memory cell of the magnetoresistive random access memory includes a magnetoresistance effect element having a magnetization pinned layer in which a magnetization direction is pinned, a recording layer having a structure in which a plurality of ferromagnetic layers are stacked with a nonmagnetic layer being provided between adjacent two ferromagnetic layers, an interaction between the adjacent two ferromagnetic layers being antiferromagnetic and the magnetization direction of the adjacent two ferromagnetic layers being changeable, and a tunnel baffler layer provided between the magnetization pinned layer and the recording layer.

8. The method of driving a magnetoresistive random access memory according to claim 5, wherein each memory cell further includes a selection transistor selecting the magnetoresistance effect element.

9. A magnetoresistive random access memory including memory cells, a state of which is switched between binary resistance values using a single kind of write pulses, the magnetoresistive random access memory comprising:
   a selection section configured to select a memory cell;
   a read section configured to read a resistance value, which is a first value of the binary resistance values, of the selected memory cell;
   a storage section configured to store the resistance value read by the read section as a first resistance value;
   a write section configured to perform a first write operation using a single set of first write pulses to change the resistance value of the selected memory cell, which is read by the read section as a first resistance value, to a second value of the binary resistance values, which is defined as a second resistance value;
   a comparison section configured to compare the second resistance value with the first resistance value; and
   a determination section configured to determine data originally stored in the selected memory cell based on a comparison result of the comparison section,
   the write section being configured to perform a second write operation on the memory cell on which the first write operation is performed using second write pulses having a same polarity as a polarity of the first write pulses to change the second resistance value of the selected memory cell back to the first resistance value.

10. The magnetoresistive random access memory according to claim 9, wherein each memory cell of the magnetoresistive random access memory includes a magnetoresistance effect element having a magnetization pinned layer in which a magnetization direction is pinned, a recording layer having a structure in which a plurality of ferromagnetic layers are stacked with a nonmagnetic layer being provided between adjacent two ferromagnetic layers, an interaction between the adjacent two ferromagnetic layers being antiferromagnetic and the magnetization direction of the adjacent two ferromagnetic layers being changeable, and a tunnel barrier layer provided between the magnetization pinned layer and the recording layer.

11. The magnetoresistive random access memory according to claim 10, wherein each memory cell further includes a selection transistor selecting the magnetoresistance effect element.

12. A magnetoresistive random access memory including memory cells, a state of which is switched between binary resistance values using a single kind of write pulses, the magnetoresistive random access memory comprising:
    a selection section configured to select a memory cell;
    a read section configured to read a resistance value, which is a first value of the binary resistance values, of the selected memory cell;
    a storage section configured to store the resistance value read by the read section;
    a write section configured to perform a first write operation using a single set of first write pulses to change the resistance value of the selected memory cell, which is read by the read section as a first resistance value, to a second value of the binary resistance values, which is defined as a second resistance value;
    a comparison section configured to compare the second resistance value with the first resistance value;
    a first determination section configured to determine data originally stored in the selected memory cell based on a comparison result of the comparison section; and
    a second determination section configured to determine whether the data originally stored in the selected memory cell is the same as data to be written, the write section being configured to perform a second write operation on the memory cell on which the first write operation is performed using second write pulses having a same polarity as a polarity of the first write pulses when the data originally stored in the selected memory cell is the same as data to be written.

13. The magnetoresistive random access memory according to claim 12, wherein each memory cell of the magnetoresistive random access memory includes a magnetoresistance effect element having a magnetization pinned layer in which a magnetization direction is pinned, a recording layer having a structure in which a plurality of ferromagnetic layers are stacked with a nonmagnetic layer being inserted between adjacent two ferromagnetic layers, an interaction between the adjacent two ferromagnetic layers being antiferromagnetic and the magnetization direction of the adjacent two ferromagnetic layers being changeable, and a tunnel barrier layer provided between the magnetization pinned layer and the recording layer.

14. The magnetoresistive random access memory according to claim 13, wherein each memory cell further includes a selection transistor selecting the magnetoresistance effect element.

15. The method of driving a magnetoresistive random access memory according to claim 1, wherein the first write operation and the second write operation use a same set of write pulses to change the resistance value of the selected memory cell.

16. The method of driving a magnetoresistive random access memory according to claim 5, wherein the first write operation and the second write operation use a same set of write pulses to change the resistance value of the selected memory cell.

17. The magnetoresistive random access memory according to claim 9, wherein the first write operation and the second write operation use a same set of write pulses to change the resistance value of the selected memory cell.

18. The magnetoresistive random access memory according to claim 12, wherein the first write operation and the second write operation use a same set of write pulses to change the resistance value of the selected memory cell.

* * * * *